United States Patent
Negi et al.

(10) Patent No.: US 12,254,936 B2
(45) Date of Patent: Mar. 18, 2025

(54) DATA STORAGE DEVICE AND METHOD FOR RUNTIME EXCLUSIVE—OR ZONING DURING FOLDING

(71) Applicant: Western Digital Technologies, Inc., San Jose, CA (US)

(72) Inventors: Pawan Negi, Bengaluru (IN); Meer Afroz Mohammed, Bengaluru (IN)

(73) Assignee: Sandisk Technologies, Inc., Milpitas, CA (US)

( * ) Notice: Subject to any disclaimer, the term of this patent is extended or adjusted under 35 U.S.C. 154(b) by 41 days.

(21) Appl. No.: 18/223,676

(22) Filed: Jul. 19, 2023

(65) Prior Publication Data
US 2024/0274213 A1    Aug. 15, 2024

Related U.S. Application Data

(60) Provisional application No. 63/444,613, filed on Feb. 10, 2023.

(51) Int. Cl.
*G11C 29/12*    (2006.01)

(52) U.S. Cl.
CPC .. *G11C 29/1201* (2013.01); *G11C 2029/1202* (2013.01)

(58) Field of Classification Search
None
See application file for complete search history.

(56) References Cited

U.S. PATENT DOCUMENTS

2018/0341406 A1* 11/2018 Sankule ............... G06F 3/0679
2024/0370333 A1* 11/2024 Khayat ................. G11C 29/08

* cited by examiner

*Primary Examiner* — Guerrier Merant
(74) *Attorney, Agent, or Firm* — Crowell & Moring LLP

(57) ABSTRACT

A data storage device initially stores incoming data from a host in single-level cell (SLC) blocks and later folds the data from those blocks into a multi-level cell (MLC) block. If an error is detected during the folding operation, the data storage device pauses the folding operation, programs data that failed to be program and other data from the initial SLC blocks into another SLC block, and then resumes the folding operation. This can be part of a dynamic runtime zoning process where the data storage device determines a set of wordlines that will fall under one zone at runtime during an enhanced post-write-read (EPWR) operation.

20 Claims, 10 Drawing Sheets

DATA STORAGE DEVICE AND METHOD FOR RUNTIME EXCLUSIVE—OR ZONING DURING FOLDING

CROSS-REFERENCE TO RELATED APPLICATION

This application claims priority to U.S. provisional patent application No. 63/444,613, filed Feb. 10, 2023, which is hereby incorporated by reference.

BACKGROUND

A host can send a write command to store data in a memory of a data storage device. The data storage device can initially store the data received from the host in a single-level cell (SLC) block in the memory and, later, write the data from the SLC block into a multi-level cell (MLC) block in the memory in a process known as "folding." An enhanced post-write-read (EPWR) operation can be performed to verify that the data was programmed into the MLC block correctly.

DETAILED DESCRIPTION

The following embodiments generally relate to a data storage device and method for runtime exclusive-or zoning during folding. In one embodiment, a data storage device is provided comprising: a memory comprising a multi-level cell (MLC) block and a plurality of single-level cell (SLC) blocks; and a controller. The controller is configured to: during a folding operation, detect an error in programming data from a wordline in a first SLC block of the plurality of SLC blocks into the MLC block; and in response to detecting the error: pause the folding operation; program, into a second SLC block of the plurality of SLC blocks, (i) the data from the wordline in the first SLC block and (ii) data from at least one other wordline in the first SLC block that is predetermined to be a failure risk; and resume the folding operation.

In another embodiment, a method is provided that is performed in a data storage device comprising a memory comprising a multi-level cell (MLC) block and a plurality of single-level cell (SLC) blocks. The method comprises: performing a folding operation in which data from a plurality of wordlines in a first SLC block of the plurality of SLC blocks is written into a zone in the MLC block; calculating parity for the zone in the MLC block; and in response to detecting an error in the data written into the zone in the MLC block: writing, into a zone in a second SLC block of the plurality of SLC blocks, data from the plurality of wordlines in the first SLC block; and re-calculating the parity for the zone in the MLC block.

In yet another embodiment, a data storage device is provided comprising: a memory comprising a multi-level cell (MLC) block and a plurality of single-level cell (SLC) blocks; and means for, in response to detecting an error during a folding operation in which data from a wordline in a first SLC block of the plurality of SLC blocks is programmed into the MLC block: pausing the folding operation; programming, into a second SLC block of the plurality of SLC blocks, the data from the wordline in the first SLC block; and resuming the folding operation.

Other embodiments are possible, and each of the embodiments can be used alone or together in combination. Accordingly, various embodiments will now be described with reference to the attached drawings.

Embodiments

The following embodiments relate to a data storage device (DSD). As used herein, a "data storage device" refers to a device that stores data. Examples of DSDs include, but are not limited to, hard disk drives (HDDs), solid state drives (SSDs), tape drives, hybrid drives, etc. Details of example DSDs are provided below.

Figure 1A:
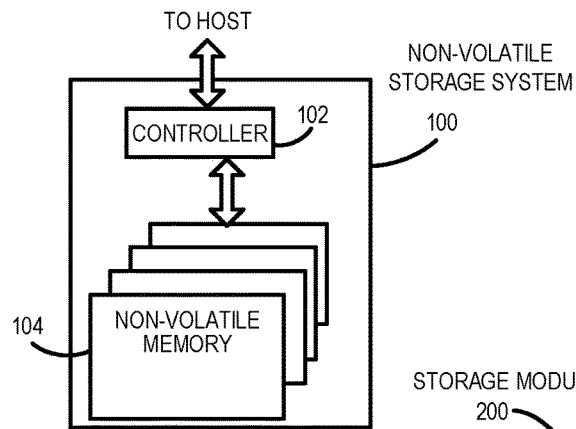
FIG. 1A is a block diagram of a data storage device of an embodiment.
Figure 1B:
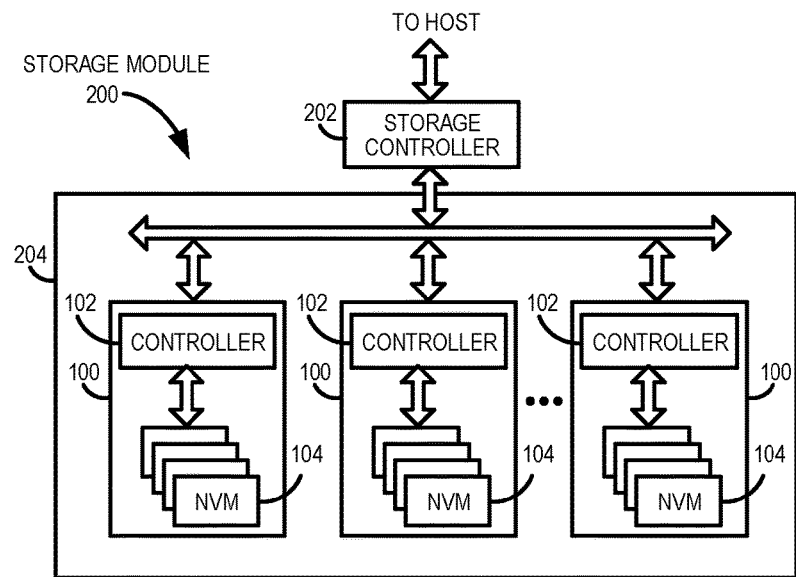
FIG. 1B is a block diagram illustrating a storage module of an embodiment.
Figure 1C:
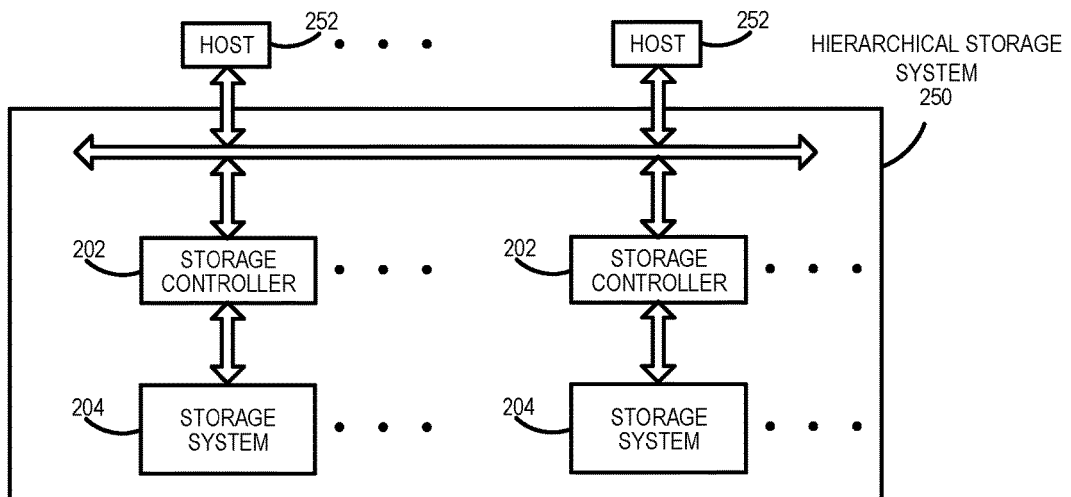
FIG. 1C is a block diagram illustrating a hierarchical storage system of an embodiment.

Data storage devices suitable for use in implementing aspects of these embodiments are shown in FIGS. 1A-1C. FIG. 1A is a block diagram illustrating a data storage device 100 according to an embodiment of the subject matter described herein. Referring to FIG. 1A, data storage device 100 includes a controller 102 and non-volatile memory that may be made up of one or more non-volatile memory die 104. As used herein, the term die refers to the collection of non-volatile memory cells, and associated circuitry for managing the physical operation of those non-volatile memory cells, that are formed on a single semiconductor substrate. Controller 102 interfaces with a host system and transmits command sequences for read, program, and erase operations to non-volatile memory die 104.

The controller 102 (which may be a non-volatile memory controller (e.g., a flash, resistive random-access memory (ReRAM), phase-change memory (PCM), or magnetoresistive random-access memory (MRAM) controller)) can take the form of processing circuitry, a microprocessor or processor, and a computer-readable medium that stores computer-readable program code (e.g., firmware) executable by the (micro)processor, logic gates, switches, an application specific integrated circuit (ASIC), a programmable logic controller, and an embedded microcontroller, for example. The controller 102 can be configured with hardware and/or firmware to perform the various functions described below and shown in the flow diagrams. Also, some of the components shown as being internal to the controller can also be stored external to the controller, and other components can be used. Additionally, the phrase "operatively in communication with" could mean directly in communication with or indirectly (wired or wireless) in communication with through one or more components, which may or may not be shown or described herein.

As used herein, a non-volatile memory controller is a device that manages data stored on non-volatile memory and communicates with a host, such as a computer or electronic device. A non-volatile memory controller can have various functionality in addition to the specific functionality described herein. For example, the non-volatile memory controller can format the non-volatile memory to ensure the memory is operating properly, map out bad non-volatile memory cells, and allocate spare cells to be substituted for future failed cells. Some part of the spare cells can be used to hold firmware to operate the non-volatile memory controller and implement other features. In operation, when a host needs to read data from or write data to the non-volatile memory, it can communicate with the non-volatile memory controller. If the host provides a logical address to which data is to be read/written, the non-volatile memory controller can convert the logical address received from the host to a physical address in the non-volatile memory. (Alternatively, the host can provide the physical address.) The non-volatile memory controller can also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused).

Non-volatile memory die 104 may include any suitable non-volatile storage medium, including resistive random-access memory (ReRAM), magnetoresistive random-access memory (MRAM), phase-change memory (PCM), NAND flash memory cells and/or NOR flash memory cells. The memory cells can take the form of solid-state (e.g., flash) memory cells and can be one-time programmable, few-time programmable, or many-time programmable. The memory cells can also be single-level cells (SLC), multiple-level cells (MLC) (e.g., dual-level cells, triple-level cells (TLC), quad-level cells (QLC), etc.) or use other memory cell level technologies, now known or later developed. Also, the memory cells can be fabricated in a two-dimensional or three-dimensional fashion.

The interface between controller 102 and non-volatile memory die 104 may be any suitable flash interface, such as Toggle Mode 200, 400, or 800. In one embodiment, the data storage device 100 may be a card based system, such as a secure digital (SD) or a micro secure digital (micro-SD) card. In an alternate embodiment, the data storage device 100 may be part of an embedded data storage device.

Although, in the example illustrated in FIG. 1A, the data storage device 100 (sometimes referred to herein as a storage module) includes a single channel between controller 102 and non-volatile memory die 104, the subject matter described herein is not limited to having a single memory channel. For example, in some architectures (such as the ones shown in FIGS. 1B and 1C), two, four, eight or more memory channels may exist between the controller and the memory device, depending on controller capabilities. In any of the embodiments described herein, more than a single channel may exist between the controller and the memory die, even if a single channel is shown in the drawings.

FIG. 1B illustrates a storage module 200 that includes plural non-volatile data storage devices 100. As such, storage module 200 may include a storage controller 202 that interfaces with a host and with data storage device 204, which includes a plurality of data storage devices 100. The interface between storage controller 202 and data storage devices 100 may be a bus interface, such as a serial advanced technology attachment (SATA), peripheral component interconnect express (PCIe) interface, or double-data-rate (DDR) interface. Storage module 200, in one embodiment, may be a solid state drive (SSD), or non-volatile dual in-line memory module (NVDIMM), such as found in server PC or portable computing devices, such as laptop computers, and tablet computers.

FIG. 1C is a block diagram illustrating a hierarchical storage system. A hierarchical storage system 250 includes a plurality of storage controllers 202, each of which controls a respective data storage device 204. Host systems 252 may access memories within the storage system 250 via a bus interface. In one embodiment, the bus interface may be a Non-Volatile Memory Express (NVMe) or Fibre Channel over Ethernet (FCoE) interface. In one embodiment, the system illustrated in FIG. 1C may be a rack mountable mass storage system that is accessible by multiple host computers, such as would be found in a data center or other location where mass storage is needed.

Figure 2A:
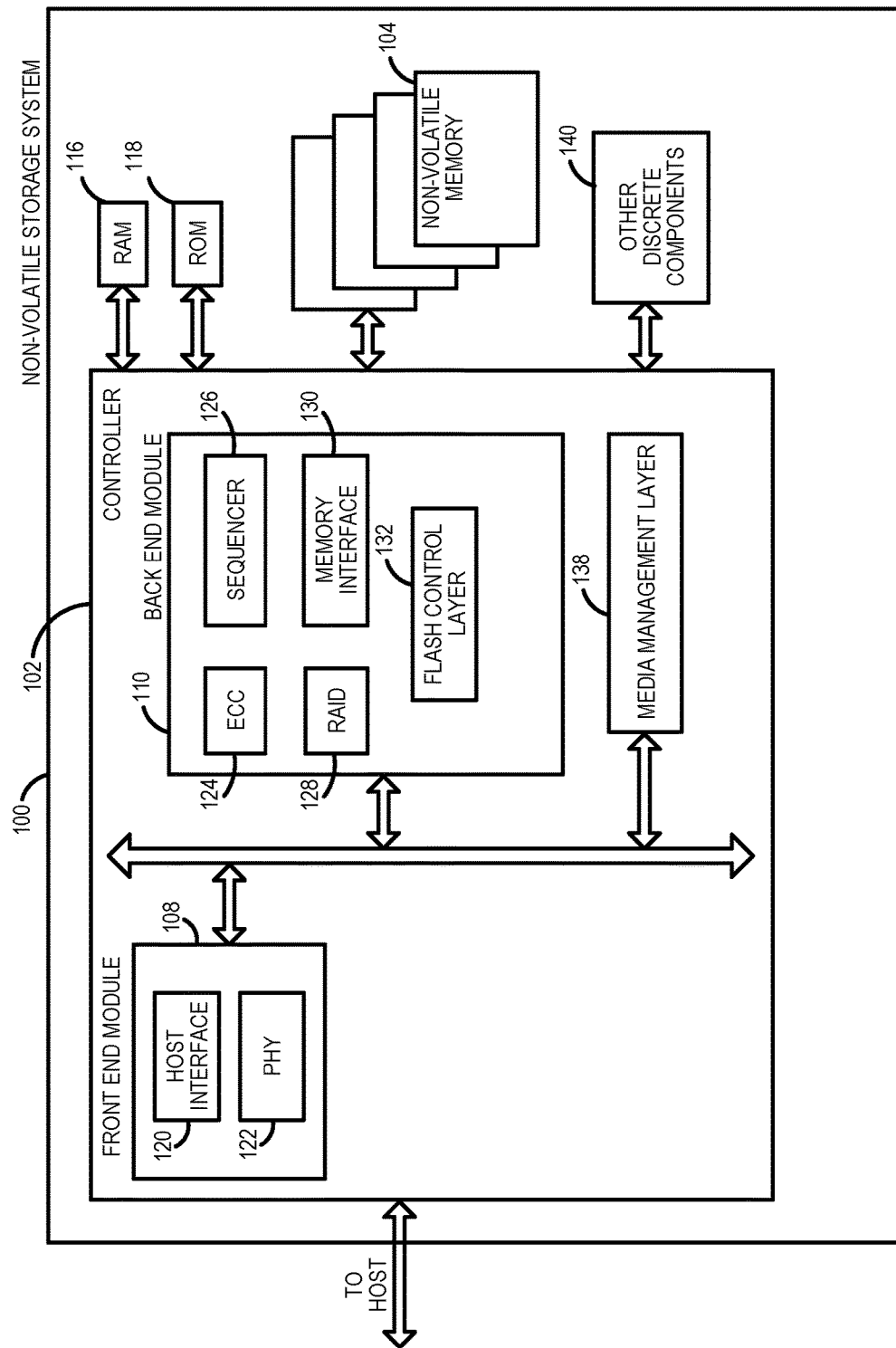
FIG. 2A is a block diagram illustrating components of the controller of the data storage device illustrated in FIG. 1A according to an embodiment.

FIG. 2A is a block diagram illustrating components of controller 102 in more detail. Controller 102 includes a front-end module 108 that interfaces with a host, a back-end module 110 that interfaces with the one or more non-volatile memory die 104, and various other modules that perform functions which will now be described in detail. A module may take the form of a packaged functional hardware unit designed for use with other components, a portion of a program code (e.g., software or firmware) executable by a (micro)processor or processing circuitry that usually performs a particular function of related functions, or a self-contained hardware or software component that interfaces with a larger system, for example. Also, "means" for performing a function can be implemented with at least any of the structure noted herein for the controller and can be pure hardware or a combination of hardware and computer-readable program code.

Referring again to modules of the controller 102, a buffer manager/bus controller 114 manages buffers in random access memory (RAM) 116 and controls the internal bus arbitration of controller 102. A read only memory (ROM) 118 stores system boot code. Although illustrated in FIG. 2A as located separately from the controller 102, in other embodiments one or both of the RAM 116 and ROM 118 may be located within the controller. In yet other embodiments, portions of RAM and ROM may be located both within the controller 102 and outside the controller.

Front-end module 108 includes a host interface 120 and a physical layer interface (PHY) 122 that provide the electrical interface with the host or next level storage controller. The choice of the type of host interface 120 can depend on the type of memory being used. Examples of host interfaces 120 include, but are not limited to, SATA, SATA Express, serially attached small computer system interface (SAS), Fibre Channel, universal serial bus (USB), PCIe, and NVMe. The host interface 120 typically facilitates transfer for data, control signals, and timing signals.

Back-end module 110 includes an error correction code (ECC) engine 124 that encodes the data bytes received from the host, and decodes and error corrects the data bytes read from the non-volatile memory. A command sequencer 126 generates command sequences, such as program and erase command sequences, to be transmitted to non-volatile memory die 104. A RAID (Redundant Array of Independent Drives) module 128 manages generation of RAID parity and recovery of failed data. The RAID parity may be used as an additional level of integrity protection for the data being written into the memory device 104. In some cases, the RAID module 128 may be a part of the ECC engine 124. A memory interface 130 provides the command sequences to non-volatile memory die 104 and receives status information from non-volatile memory die 104. In one embodiment, memory interface 130 may be a double data rate (DDR) interface, such as a Toggle Mode 200, 400, or 800 interface. A flash control layer 132 controls the overall operation of back-end module 110.

The data storage device 100 also includes other discrete components 140, such as external electrical interfaces, external RAM, resistors, capacitors, or other components that may interface with controller 102. In alternative embodiments, one or more of the physical layer interface 122, RAID module 128, media management layer 138 and buffer management/bus controller 114 are optional components that are not necessary in the controller 102.

Figure 2B:
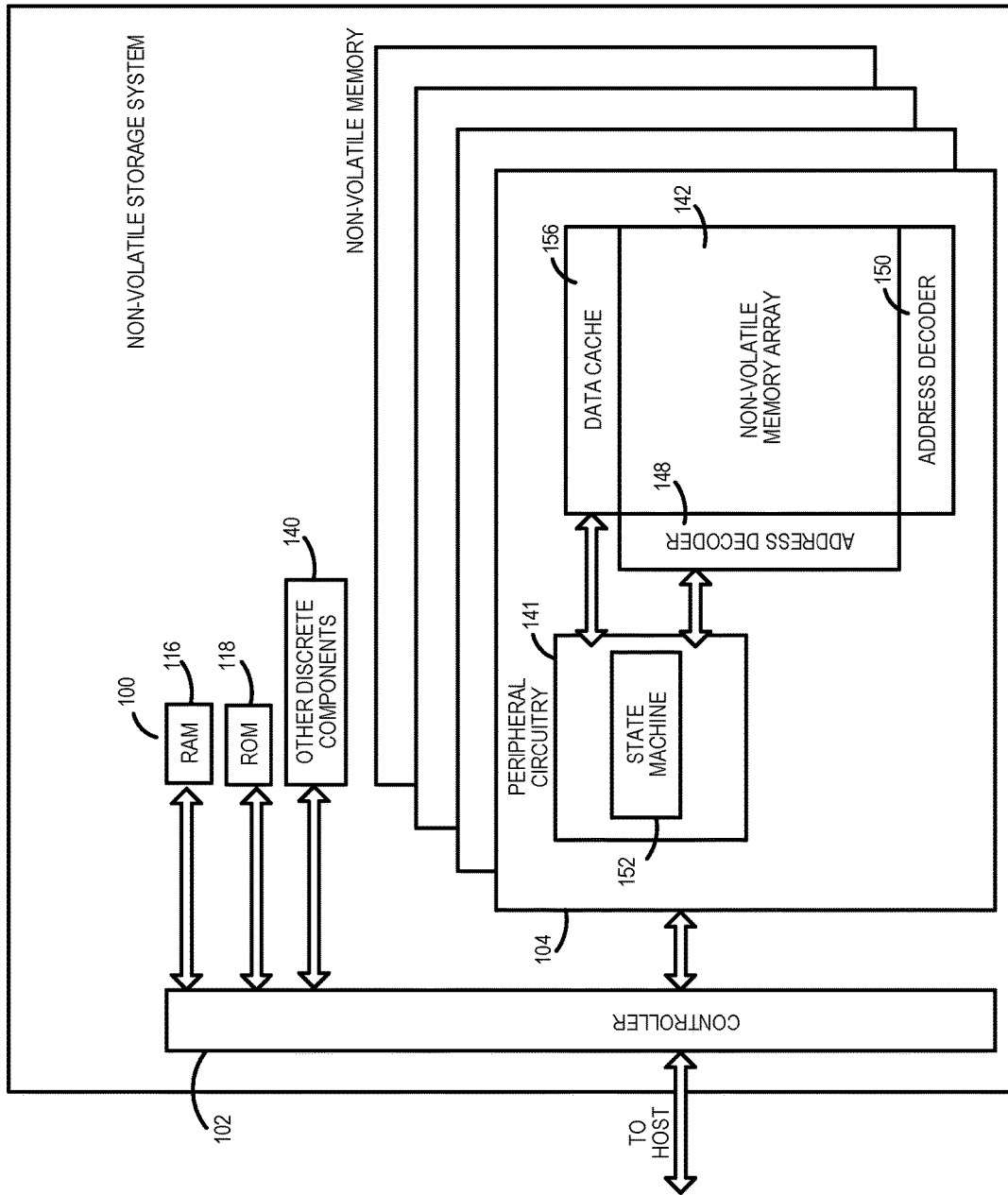
FIG. 2B is a block diagram illustrating components of the memory data storage device illustrated in FIG. 1A according to an embodiment.

FIG. 2B is a block diagram illustrating components of non-volatile memory die 104 in more detail. Non-volatile memory die 104 includes peripheral circuitry 141 and non-volatile memory array 142. Non-volatile memory array 142 includes the non-volatile memory cells used to store data. The non-volatile memory cells may be any suitable non-volatile memory cells, including ReRAM, MRAM, PCM, NAND flash memory cells and/or NOR flash memory cells in a two-dimensional and/or three-dimensional configuration. Non-volatile memory die 104 further includes a data cache 156 that caches data. Peripheral circuitry 141 includes a state machine 152 that provides status information to the controller 102.

Returning again to FIG. 2A, the flash control layer 132 (which will be referred to herein as the flash translation layer (FTL) or, more generally, the "media management layer," as the memory may not be flash) handles flash errors and interfaces with the host. In particular, the FTL, which may be an algorithm in firmware, is responsible for the internals of memory management and translates writes from the host into writes to the memory 104. The FTL may be needed because the memory 104 may have limited endurance, may be written in only multiples of pages, and/or may not be written unless it is erased as a block. The FTL understands these potential limitations of the memory 104, which may not be visible to the host. Accordingly, the FTL attempts to translate the writes from host into writes into the memory 104.

The FTL may include a logical-to-physical address (L2P) map (sometimes referred to herein as a table or data structure) and allotted cache memory. In this way, the FTL translates logical block addresses ("LBAs") from the host to physical addresses in the memory 104. The FTL can include other features, such as, but not limited to, power-off recovery (so that the data structures of the FTL can be recovered in the event of a sudden power loss) and wear leveling (so that the wear across memory blocks is even to prevent certain blocks from excessive wear, which would result in a greater chance of failure).

Figure 3:
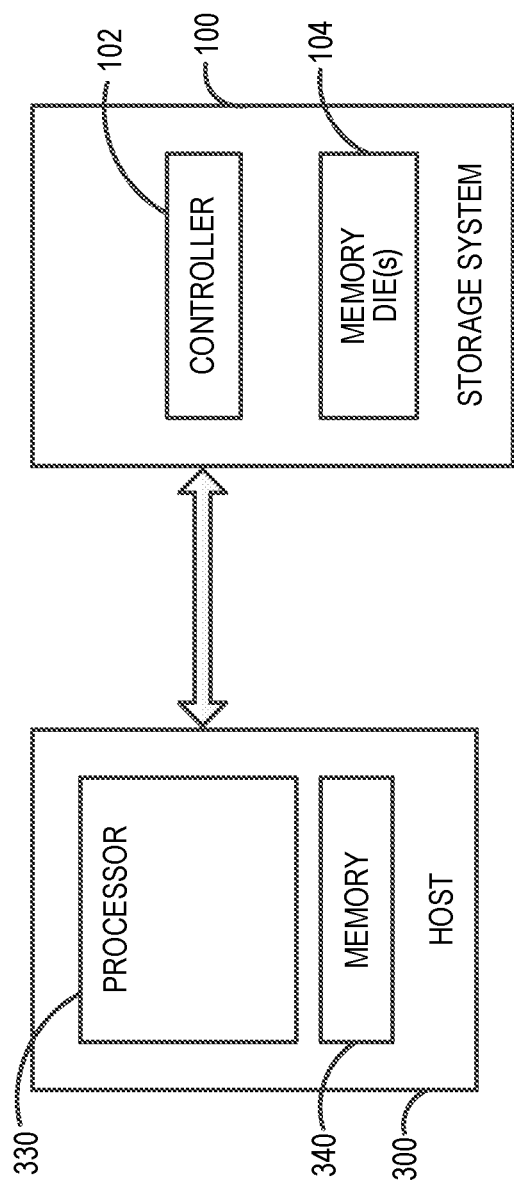
FIG. 3 is a block diagram of a host and data storage device of an embodiment.

Turning again to the drawings, FIG. 3 is a block diagram of a host 300 and data storage device 100 of an embodiment. The host 300 can take any suitable form, including, but not limited to, a computer, a mobile phone, a tablet, a wearable device, a digital video recorder, a surveillance system, etc. The host 300 in this embodiment (here, a computing device) comprises a processor 330 and a memory 340. In one embodiment, computer-readable program code stored in the host memory 340 configures the host processor 330 to perform the acts described herein. So, actions performed by the host 300 are sometimes referred to herein as being performed by an application (computer-readable program code) run on the host 300. For example, the host 300 can be configured to send data (e.g., initially stored in the host's memory 340) to the data storage device 100 for storage in the data storage device's memory 104.

As mentioned above, the host 300 can send a write command to store data in the memory 104 of the data storage device 100. The data storage device 100 can initially store the incoming data from the host 300 in a single-level cell (SLC) block in the memory 104 to help guarantee high speed and endurance. Later, the data can be written from the SLC block into a multi-level cell (MLC) block in the memory 104 in process known as "folding" (e.g., by pooling either three or four SLC source blocks to form one TLC block or one QLC block, respectively). An enhanced post-write-read (EPWR) operation can be performed to verify that the data was programmed into the MLC block correctly. More specifically, during an EPWR operation, a read sense can be performed on each page (e.g., at the flash management unit (FMU) level) of each wordline in the physical MLC block after the data has been programmed into the block.

In non-prime kinds of memory material, there is a very high chance of having multiple defective wordlines in a block. In such materials, during the EPWR operation, multiple wordlines may be found to fail. However, the original data is still intact in the SLC block. So, the data from the failed wordlines can be copied from the SLC block to a new SLC block in a process referred to herein as "commit logic."

Additionally, non-prime material may sometimes be so defective that the programming of a wordline can cause errors in adjacent wordlines. Such defect-related data can be predetermined for various memory modes and materials. To prevent data loss on the neighboring wordlines, when a given wordline is found to be defective, data from that wordline and the adjacent wordlines can be copied to a new SLC block as per the commit logic. The threshold of such wordlines to be copied to the new SLC block is referred to herein as a guard band.

Figure 4:
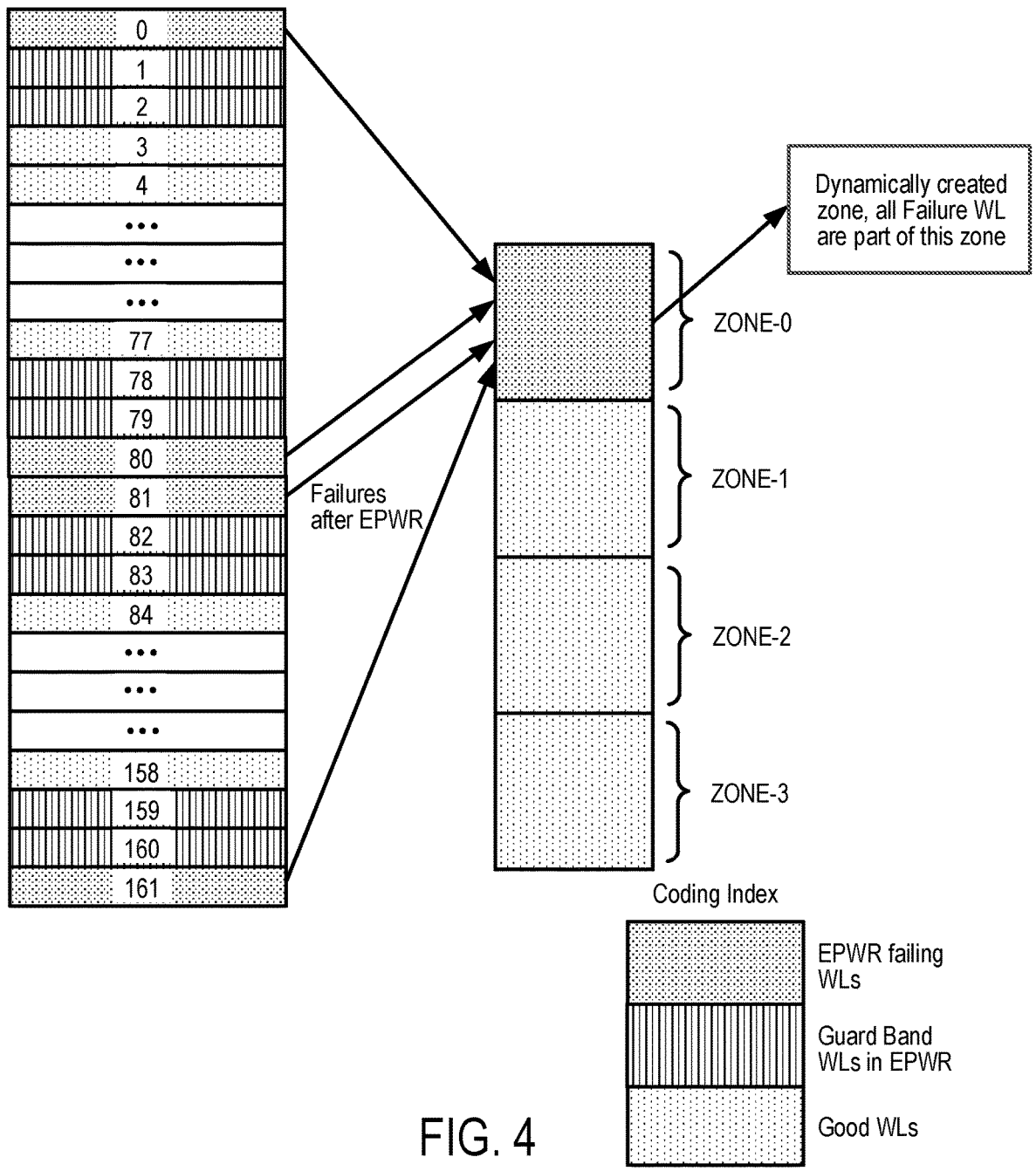
FIG. 4 is an illustration of a method of an embodiment for writing data from failed wordlines into a zone.

In one embodiment, the controller 102 of the data storage device 100 can handle multiple wordlines across multiple meta blocks and group them into one area referred to herein as a "zone" (see FIG. 4). The use of a zone helps to reduce the exclusive-or (XOR) unroll time and to strengthen the XOR parity protection at a desired wordline level. Upon an EPWR failure on a wordline in the MLC block, the controller 102 can commit the data of the complete zone from the SLC source block (each zone can have separate sets of parities). Full zone commit may be needed to keep the XOR protection of that particular zone intact.

The commit of the data from the SLC block to the MLC block can be done based on various conditions. For example, one condition may be that the complete zone from where the wordline has failed needs to commit from the source block. If the complete zone is not committed and just the guard band wordline is committed (e.g., failing wordline+N and failing wordline-N), XOR protection of that zone may be lost. As an example of another condition, in the case of a full zone commit, there is a possibility that multiple wordlines might fail for EPWR reasons. In such a case, if all the failing EPWR wordlines fall into different zones, the complete MLC block can be committed from the source SLC blocks. This problem is referred to herein as the "full zone commit" problem and is illustrated in FIG. 5.

Figure 5:
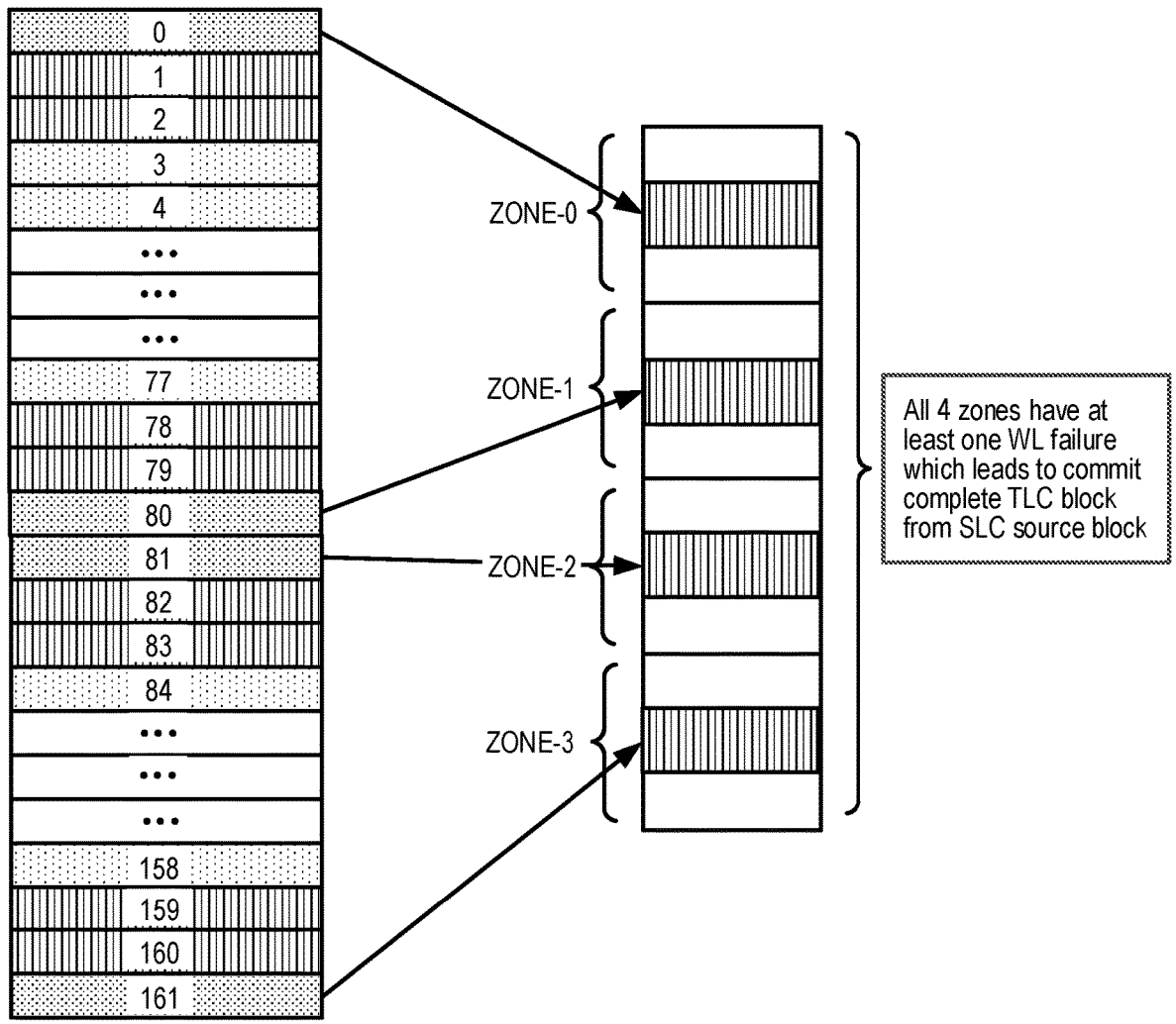
FIG. 5 is an illustration of a full zone commit problem.
Figure 6:
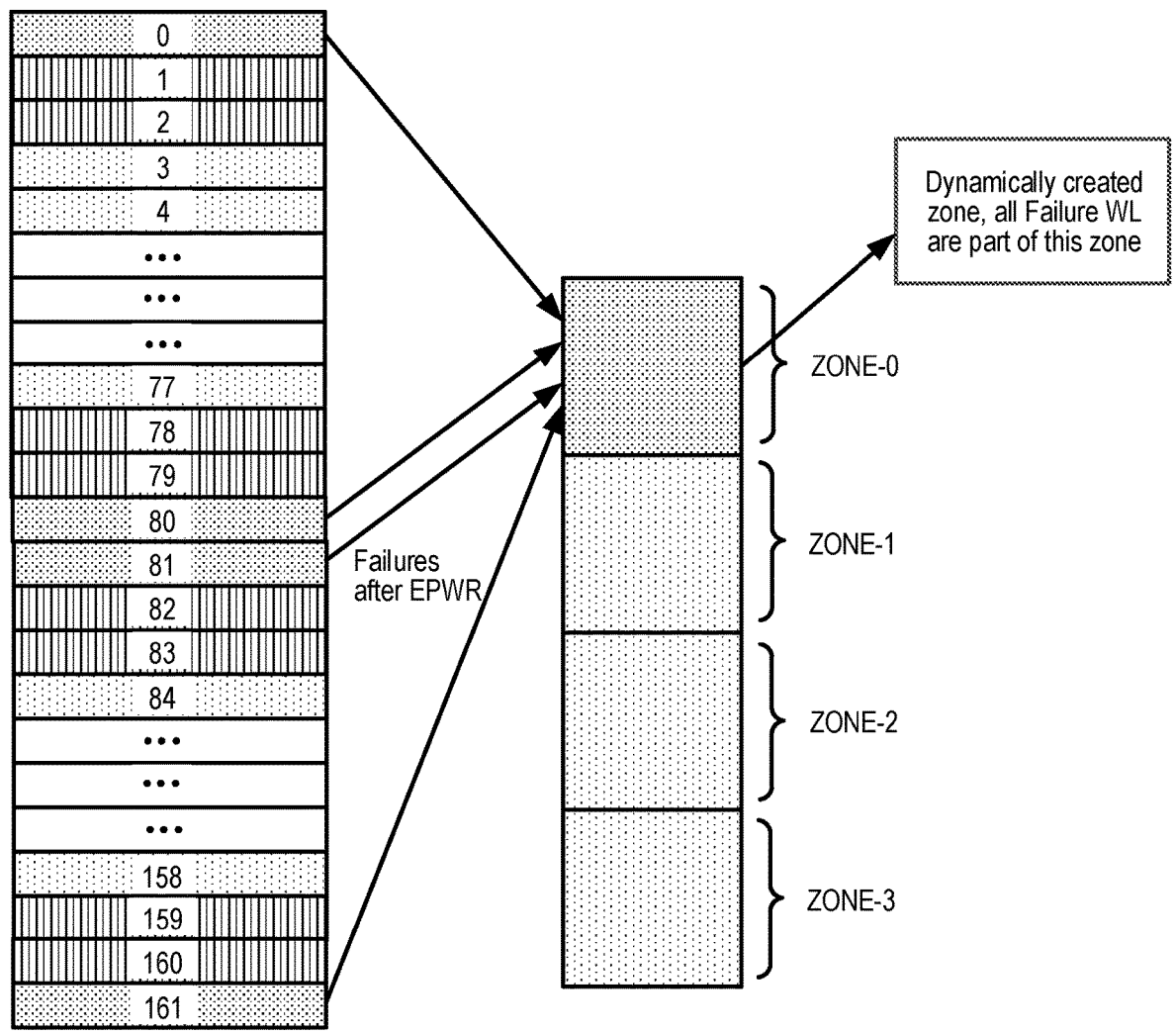
FIG. 6 is an illustration of a solution of an embodiment to a full zone commit problem.

In the four-zone configuration shown in FIG. 5, there is a total of four failed wordlines (WL0, WL80, WL81, WL161) during the EPWR operation on an MLC block, and all four failed wordlines are from different zones. To protect the data, data from all four zones (the complete MLC block) would need to be committed from the SLC source block.

In one embodiment, to solve the full zone commit problem, a runtime zoning concept is used in which the controller 102 of the data storage device 100 determines a set of wordlines that will fall under one zone dynamically at the runtime during the EPWR operation. As used herein, a "runtime zone" refers to a zone that is formed dynamically based on the needs of the user. Instead of being static or fixed, a runtime zone is dynamically created by the controller 102 to handle the distribution of zones across different levels of wordlines (e.g., based on a system-defined algorithm).

For example, during every memory node transition, a memory health team can evaluate the memory design to understand which wordlines have a high tendency of EPWR failure. These wordlines along with wordlines that fail for EPWR reasons during runtime operations can be clubbed together and form a new runtime zone. In such type of zoning, only runtime EPWR-failing wordlines may be committed. In non-prime memories, where there is a high tendency of EPWR failing wordlines corrupting adjacent/neighboring wordlines, the runtime zoning technique can be enhanced to accommodate the guard band wordlines as well (e.g., the EPWR failing wordlines±N wordlines).

Figure 7:
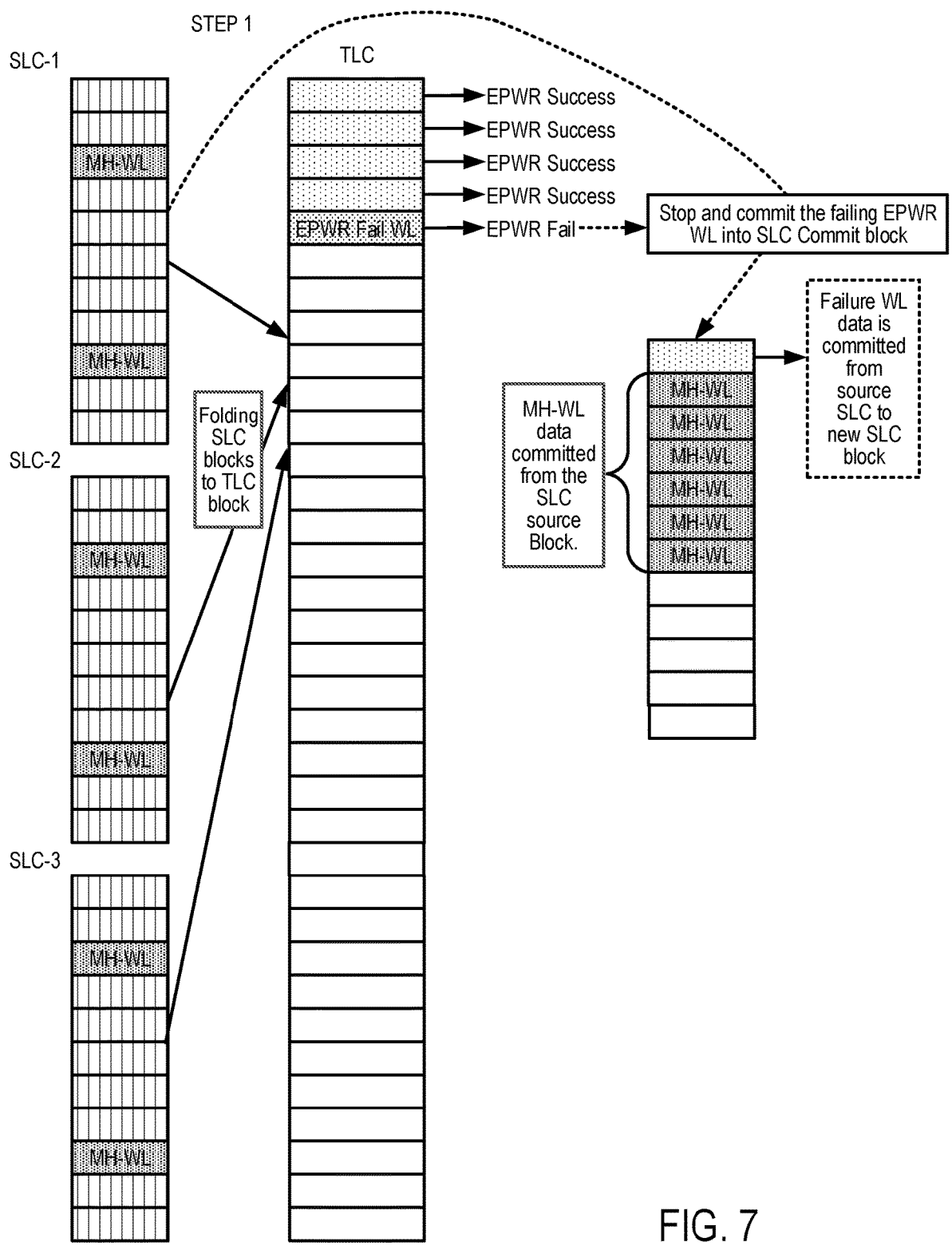
FIGS. 7 and 8 are illustrations of a method of an embodiment for handling runtime zoning during a rolling enhanced post-write read (EPWR) operation.
Figure 8:
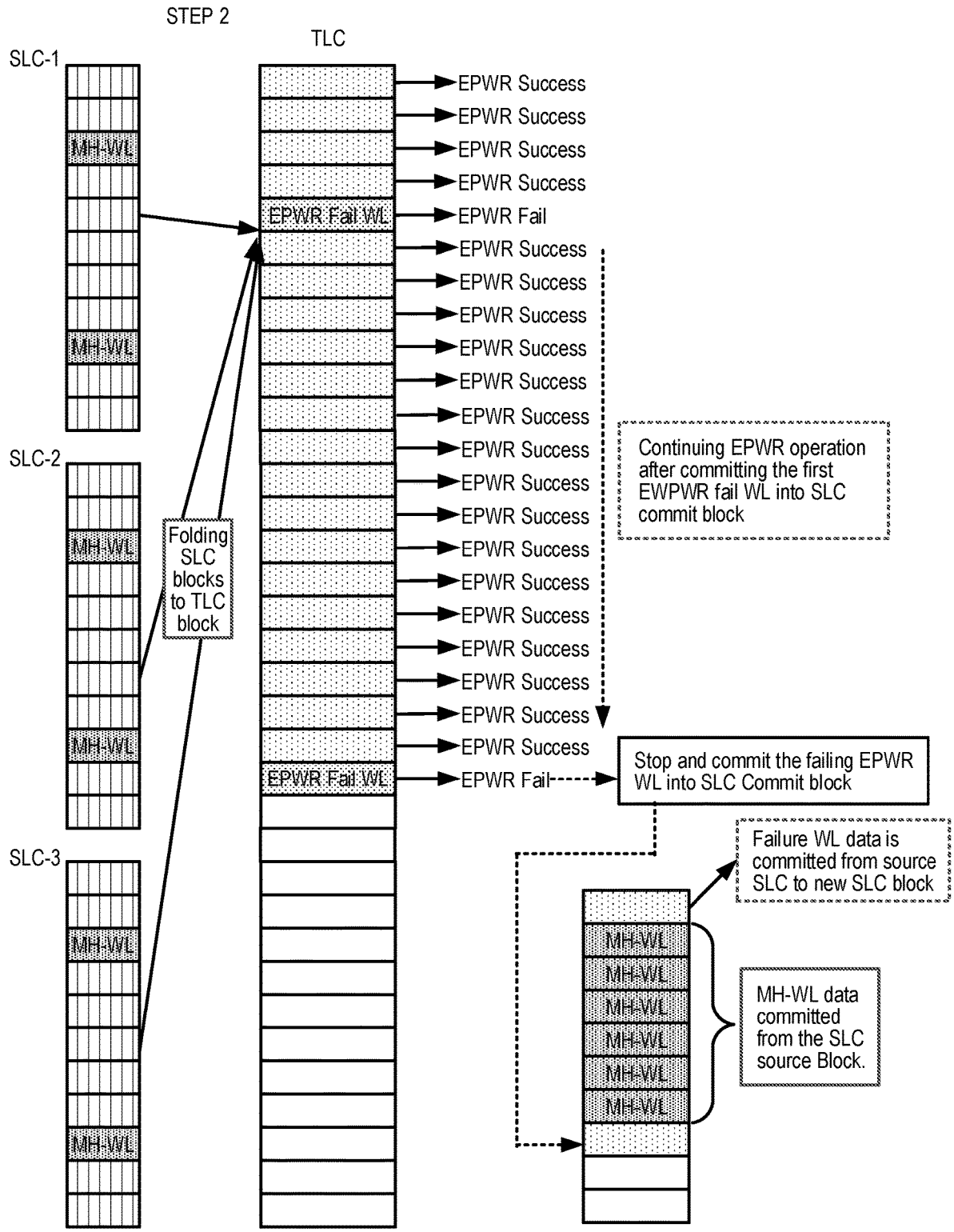

Returning to the drawings, FIGS. 7 and 8 illustrate a method that can be performed by the controller 102 to handle runtime zoning during a rolling EPWR operation. In this embodiment, during folding, the controller 102 copies data from SLC block to the MLC block one wordline at a time. Once the MLC program operation is completed on one wordline at a given time, the controller 102 pauses and starts a rolling EPWR operation. In this approach, the controller 102 sends a read command on the already-programmed wordline in the MLC block as part of the EPWR operation. Once the EPWR operation is successful on the written wordline, the controller 102 proceeds to the next wordline to repeat the EPWR check.

At a given instant, if the EPWR check fails on a wordline, the controller 102 can immediately stop and commit the failing EPWR wordline from the SLC source block to a new SLC block. After that, the controller 102 can also commit the wordlines given by the memory health data. Post commit, the controller 12 can continue to repeat the EPWR operation on the remaining wordlines of the block until the last wordline. In between, if the controller 102 encounters another EPWR fail on some other wordline, the controller 102 can repeat the above process of committing that failing EPWR wordline into the SLC commit block along with relevant memory health wordlines. FIGS. 7 and 8 illustrate this two-step rolling EPWR process.

Figure 9:
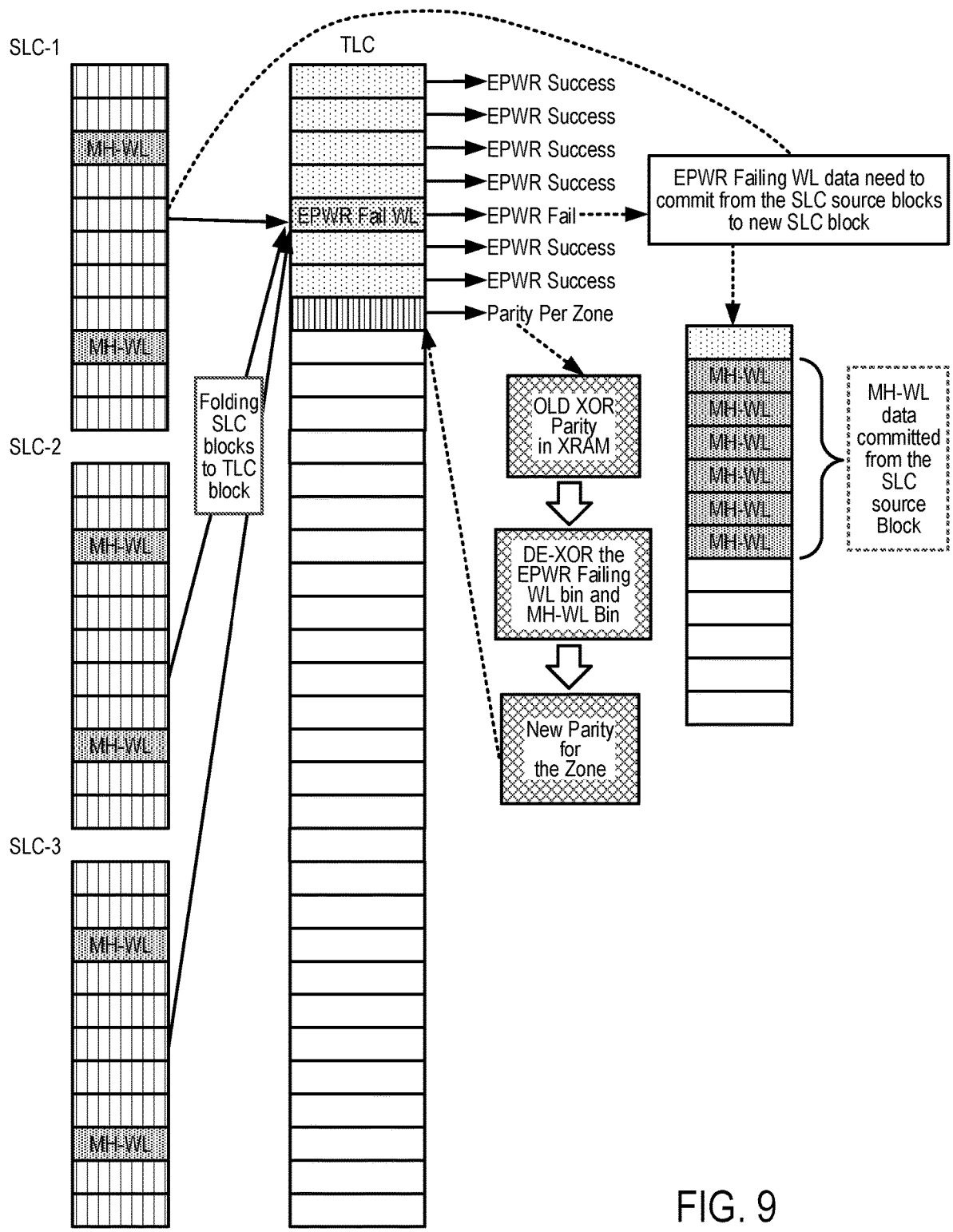
FIG. 9 is an illustration of a method of an embodiment for handling runtime zoning during a phased EPWR operation.

As another example, FIG. 9 illustrates a method of an embodiment for handling runtime zoning during a phased EPWR operation. Phased EPWR is an approach where the overall EPWR process is divided into multiple phases based on the number of zones. Once the EPWR is completed for one zone (e.g., a set of wordlines) the controller 102 can calculate parity for that zone, write the parity into the last wordlines of that zone, and then move to the next zone.

If one or multiple wordlines failed for EPWR reasons on a particular zone, it may desired to both avoid losing the data of the failing wordline and keep the XOR protection of the zone intact. To achieve this, the controller 102 can first take out the failing bin from the already-calculated parity by performing a DE-XOR of the failing bin and then write the new parity into the last wordline of the zone. Meanwhile, the controller 102 can commit the data from the failing wordline from the source SLC block to a new SLC block. The controller 102 can calculate the parity for that wordline based on the new zone formed in the SLC commit block.

There are several advantages associated with these embodiments. For example, multiple zone or full block commits can be avoided during EPWR fails, which would easily save firmware error handling time. Also, these embodiments can help reduce write amplification, help give additional parity protection to the failing wordlines in the runtime zone, help improve block budget, and help increase performance.

Finally, as mentioned above, any suitable type of memory can be used. Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured.

The semiconductor memory elements located within and/or over a substrate may be arranged in two or three dimensions, such as a two-dimensional memory structure or a three-dimensional memory structure.

In a two-dimensional memory structure, the semiconductor memory elements are arranged in a single plane or a single memory device level. Typically, in a two-dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and wordlines.

A three-dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three-dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this invention is not limited to the two dimensional and three-dimensional structures described but cover all relevant memory structures within the spirit and scope of the invention as described herein and as understood by one of skill in the art.

It is intended that the foregoing detailed description be understood as an illustration of selected forms that the invention can take and not as a definition of the invention. It is only the following claims, including all equivalents, that are intended to define the scope of the claimed invention. Finally, it should be noted that any aspect of any of the embodiments described herein can be used alone or in combination with one another.

What is claimed is:

1. A data storage device comprising:
   a memory comprising a multi-level cell (MLC) block and a plurality of single-level cell (SLC) blocks; and
   a processor coupled with the memory and configured to:
      during a folding operation:
         read data from a wordline in a first SLC block of the plurality of SLC blocks;
         program, into a wordline in the MLC block, the data read from the wordline in the first SLC block;
         perform a post-write read operation on the wordline in the MLC block to detect an error in programming the data read from the wordline in the first SLC block; and
      in response to detecting the error:
         pause the folding operation;
         program, into a second SLC block of the plurality of SLC blocks, (i) the data read from the wordline in the first SLC block and (ii) data from at least one wordline in the first SLC block; and
         resume the folding operation.

2. The data storage device of claim 1, wherein the processor is further configured to:
   copy data from the first SLC block into the MLC block one wordline at a time; and
   perform, on a rolling wordline-by-wordline basis, an error detection operation on the data copied into the MLC block.

3. The data storage device of claim 1, wherein the at least one other wordline comprises memory health wordline(s).

4. The data storage device of claim 1, wherein the processor is further configured to:
   program, into the second SLC block, data from adjacent wordline(s) in the first SLC block.

5. The data storage device of claim 1, wherein the second SLC block comprises a runtime zone comprising data from a plurality of wordlines across a plurality of metablocks.

6. The data storage device of claim 1, wherein the processor is further configured to:
   in response to detecting an error in programming data into the MLC block from a wordline in a third SLC block of the plurality of SLC blocks, program, into the second SLC block or another SLC block of the plurality of SLC blocks data from the wordline in the third SLC block.

7. The data storage device of claim 1, wherein the at least one wordline in the first SLC block is predetermined to be a failure risk.

8. The data storage device of claim 1, wherein the MLC block comprises a triple-level cell (TLC) block.

9. The data storage device of claim 1, wherein the MLC block comprises a quad-level cell (QLC) block.

10. The data storage device of claim 1, wherein the memory comprises a three-dimensional memory.

11. A data storage device comprising:
a memory comprising a multi-level cell (MLC) block and a plurality of single-level cell SLC) blocks; and
means for:
reading data from a wordline in a first SLC block of the plurality of SLC blocks;
programming, into a wordline in the MLC block, the data read from the wordline in the first SLC block;
performing a post-write read operation on the wordline in the MLC block to detect an error in programming the data read from the wordline in the first SLC block; and
in response to detecting the error:
pausing the folding operation;
programming, into a second SLC block of the plurality of SLC blocks, (i) the data read from the wordline in the first SLC block and (ii) data from at least one wordline in the first SLC block; and
resuming the folding operation.

12. In a data storage device comprising a memory comprising a multi-level cell (MLC) block and a plurality of single-level cell (SLC) blocks, a method comprising:
reading data from a wordline in a first SLC block of the plurality of SLC blocks;
programming, into a wordline in the MLC block, the data read from the wordline in the first SLC block;
performing a post-write read operation on the wordline in the MLC block to detect an error in programming the data read from the wordline in the first SLC block; and
in response to detecting the error:
pausing the folding operation;
programming, into a second SLC block of the plurality of SLC blocks, (i) the data read from the wordline in the first SLC block and (ii) data from at least one wordline in the first SLC block; and
resuming the folding operation.

13. The method of claim 12, further comprising:
copying data from the first SLC block into the MLC block one wordline at a time; and
performing, on a rolling wordline-by-wordline basis, an error detection operation on the data copied into the MLC block.

14. The method of claim 12, further comprising:
programming, into the second SLC block of the plurality of SLC blocks, data from at least one other wordline in the first SLC block that is predetermined to be a failure risk.

15. The method of claim 12, further comprising:
programming, into the second SLC block, data from adjacent wordline(s) in the first SLC block.

16. The method of claim 12, wherein the second SLC block comprises a runtime zone comprising data from a plurality of wordlines across a plurality of metablocks.

17. The method of claim 12, further comprising:
in response to detecting an error in programming data into the MLC block from a wordline in a third SLC block of the plurality of SLC blocks, programming, into the second SLC block or another SLC block of the plurality of SLC blocks data from the wordline in the third SLC block.

18. The method of claim 12, wherein the at least one wordline in the first SLC block is predetermined to be a failure risk.

19. The method of claim 12, wherein the MLC block comprises a triple-level cell (TLC) block.

20. The method of claim 12, wherein the MLC block comprises a quad-level cell (QLC) block.

* * * * *